United States Patent [19]

Kuroyanagi et al.

[11] Patent Number: 4,782,246

[45] Date of Patent: Nov. 1, 1988

[54] PHASE SHIFT CIRCUIT FOR ELECTRICAL SIGNAL

[75] Inventors: Tomomitsu Kuroyanagi, Katsuta; Yukinari Ueki, Yokohama; Shuzo Matsumoto, Fujisawa; Masanori Kamiya, Yokohama, all of Japan

[73] Assignee: Hitachi, Ltd., Tokyo, Japan

[21] Appl. No.: 62,587

[22] Filed: Jun. 16, 1987

[30] Foreign Application Priority Data

Jun. 16, 1986 [JP] Japan ................................ 61-138318

[51] Int. Cl.⁴ ............................................. H03K 5/00
[52] U.S. Cl. .................................... 307/262; 328/155; 330/260; 330/305; 330/306; 358/19
[58] Field of Search ............... 330/252, 260, 302, 303, 330/305, 306; 328/155; 307/262, 511, 512, 514; 358/17, 19

[56] References Cited

U.S. PATENT DOCUMENTS 3,436,647  4/1969  Gobeli et al. .................. 307/262 X
4,306,198  12/1981  Okada ............................ 330/306 X Primary Examiner—James B. Mullins
Attorney, Agent, or Firm—Antonelli, Terry & Wands

[57] ABSTRACT

A phase shift circuit comprises a variable phase shifter responsive to an externally supplied voltage to change the amount of phase shift, and a phase detector operative to detect a phase difference between input and output signals of the variable phase shifter and supply a voltage complying with the phase difference to the variable phase shifter. When the center frequency of the variable phase shifter is changed by reason of production errors and temperature variations to deviate the phase shift amount from a desired value, the phase detector controls the center frequency such that the phase shift amount can be fixed to the desirably predetermined value.

4 Claims, 3 Drawing Sheets

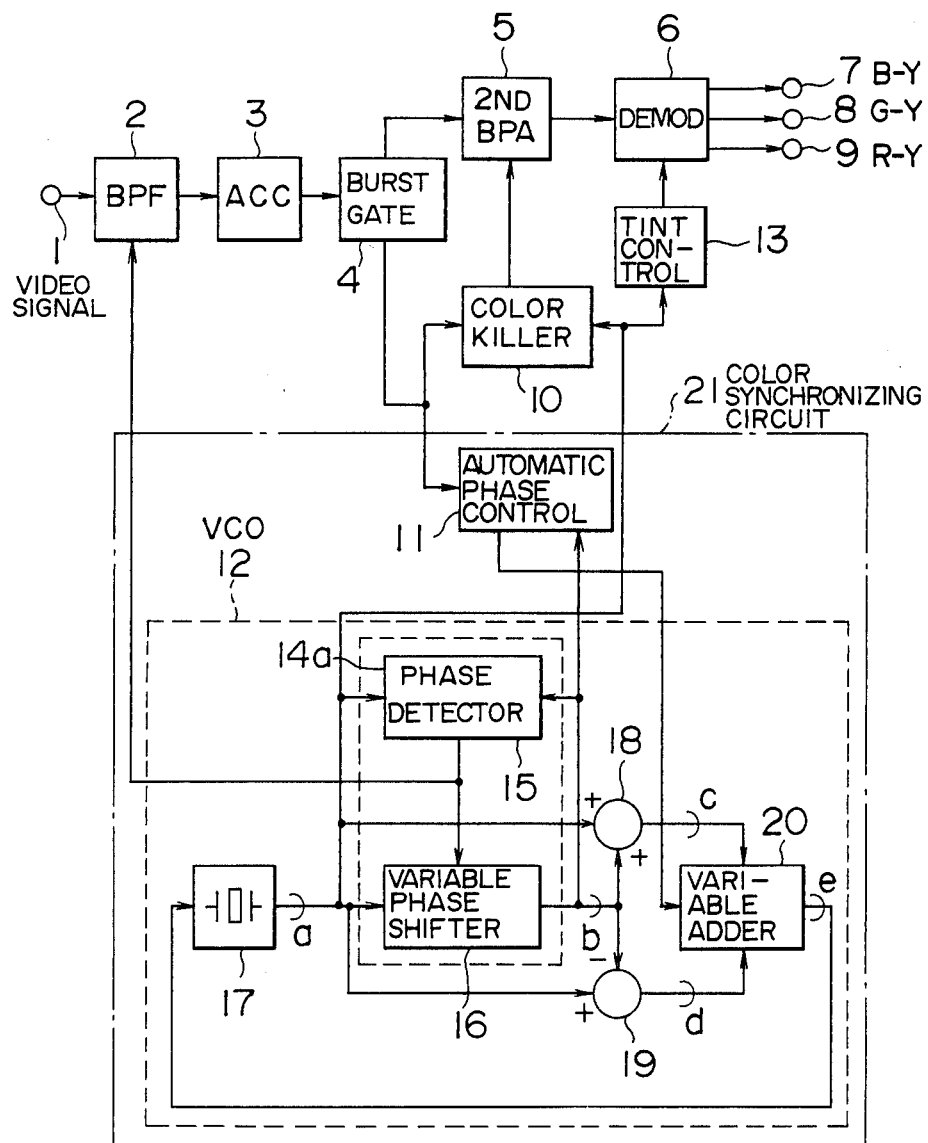

PHASE SHIFT CIRCUIT FOR ELECTRICAL SIGNAL

BACKGROUND OF THE INVENTION

This invention relates to a phase shift circuit suited to be used with the amount of phase shift fixed to a predetermined value.

Since, in a circuitry incorporating a phase shift circuit and integrated on a semiconductor chip, values of resistance and capacitance of integrated resistors and capacitors become non-uniform by reason of production errors and particularly the resistance values vary with temperatures, the amount of phase shift by the phase shift circuit is also varied with the errors and/or the temperature dependent variations. Accordingly, it is desirable that the phase shift circuit integrated as such be used as a variable phase shift circuit which can externally be changed in phase shift amount. An example of this type of phase shift circuit, variable in phase shift amount, is disclosed in U.S. Pat. No. 4,306,198.

In the phase shift circuit described in this U.S. Pat. No. 4,306,198, the phase shift amount is made variable but it is in no way taken into consideration that the phase shift circuit may be used with the amount of phase shift fixed to a predetermined value. Thus, the prior art phase shift circuit is disadvantageous in that a predetermined amount of phase shift can not be obtained regardless of production errors and temperature variations. Further, the prior art phase shift circuit can not be manufactured as an integrated phase shift circuit for use at low frequencies because resistors and capacitors having large resistance and capacitance values are difficult to integrate.

SUMMARY OF THE INVENTION

An object of this invention is to provide a phase shift circuit capable of changing the amount of phase shift and generating desirably predetermined amounts of phase shift regardless of production errors and temperature variations.

According to the present invention, a phase shift circuit comprises a variable phase shifter which can be changed in phase shift amount by a control signal supplied externally, and a phase detector operative to detect a phase difference between input and output signals of the variable phase shifter so as to generate a detection voltage complying with the phase difference and supply the detection voltage as the control signal in a direction in which variations in the phase shift amount are cancelled, whereby the amount of phase shift by the phase shift circuit can be so controlled as to be fixed to a desirably predetermined value.

BRIEF DESCRIPTION OF THE DRAWINGS

FIG. 4 is a block diagram showing a color synchronizing circuit of television receiver set to which the phase shift circuit of the invention is applied.

DESCRIPTION OF THE PREFERRED EMBODIMENTS

Figure 1:
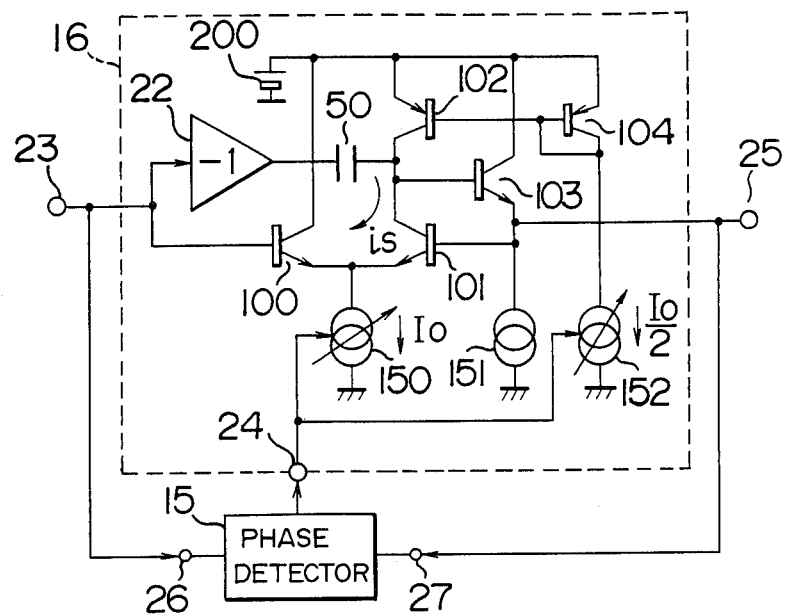
FIG. 1 is a circuit diagram showing a phase shift circuit according to an embodiment of the invention.

Referring now to FIG. 1, a phase shift circuit according to an embodiment of the invention comprises a variable phase shifter 16 and a phase detector 15.

Figure 5:
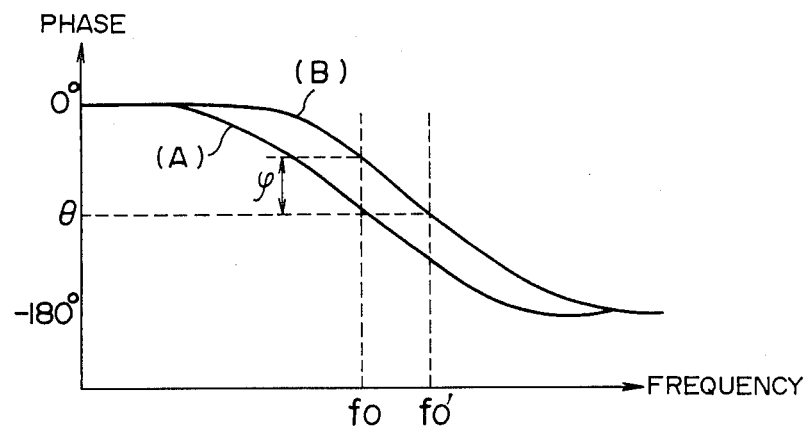
FIG. 5 is a graph showing the deviation from a designed relationship between phase shift and frequency and an actual relationship realized when the circuit is constructed as an integrated circuit.

When the phase shifter is realized with an integrated circuit, resistance and capacitance values of integrated resistors and capacitors deviate from their design values by reason of production errors and an actually manufactured phase shifter exhibits a characteristic curve (B) which deviates from a designed characteristic curve (A), as graphically illustrated in FIG. 5. It follows therefore that the frequency at which an amount of phase shift $\theta$ is obtained deviates from $f_0$ to $f_0'$. Accordingly, with a signal of frequency $f_0$ applied to the phase shifter, an output signal of this phase shifter undergoes a $\theta + \phi$ phase shift. The phase shift circuit of this invention has the phase detector 15 adapted to detect a phase difference between input and output signals of the variable phase shifter 16 and generate an output voltage complying with the phase difference by which the center frequency of the variable phase shifter can be controlled to a desirably predetermined value, that is, $f_0$.

An AC signal supplied to a terminal 23 of the phase shift circuit is applied to the base electrode of one of transistors constituting a differential amplifier pair, that is, a transistor 100 and to a phase inverting circuit 22. A phase-inverted signal from the phase inverting circuit 22 is applied to the base electrode of the other transistor 101 of the differential amplifier pair through a capacitor 50 and a transistor 103 connected in emitter follower configuration. The emitter electrodes of the transistors 100 and 101 are connected in common to a variable current source 150. Current value of the variable current source 150 and current value of a variable current source 152 can both be changed by the value of DC voltage supplied to a terminal 24. The current value of the variable current source 152 is set so as to always be half the current value of the variable current source 150. A transistor 104 connected in diode configuration cooperates with a transistor 102 to form a current mirror circuit in which collector/emitter current, of the transistor 102 equals the current value of the variable current source 152. Thus, collector current of the transistor 102 is half the current value of the variable current source 150. The emitter electrode of the transistor 103 is connected to an output terminal 25.

Where the voltage value of a signal supplied to the input terminal 23 is $V_{in}$, the voltage value of an output signal at the output terminal 25 is $V_{out}$, the current value of the variable current source 150 is $I_0$, the current value of the variable current source 152 is $I_0/2$, an AC current flowing through the collector of the transistor 101 is $i_s$ and emitter resistance of the transistors 100 and 101 are respectively $r_e1$ and $r_e2$, the AC current $i_s$ can be expressed as $$i_s = \frac{V_{in} - V_{out}}{r_e1 + r_e2}. \tag{1}$$

Since the transistor 102 connected to the collector electrode of the transistor 101 acts as a current source, the AC component $i_s$ of collector current of the transistor 101 also flows through the capacitor 50. The output voltage $V_{out}$ substantially equals base voltage of the transistor 103, amounting to the sum of a voltage generated by the current $i_s$ flowing through the capacitor 50 and the phase-inverted voltage of the input signal voltage $V_{in}$ and is expressed as $$V_{out} = \frac{i_s}{j\omega C} - V_{in} \qquad (2)$$

where C is a capacitance of the capacitor 50. By substituting equation (1) into equation (2), there results $$V_{out} = \frac{V_{in} - V_{out}}{r_e1 + r_e2} \cdot \frac{1}{j\omega C} - V_{in} \qquad (3)$$

Equation (3) is rewritten as $$\left\{1 + \frac{1}{(r_e1 + r_e2)j\omega C}\right\}V_{out} = -\left(1 - \frac{1}{(r_e1 + r_e2)j\omega C}\right)V_{in} \qquad (4)$$

From equation (4), a transfer function H(S) of the phase shift circuit is obtained as follows:

$$\begin{aligned} H(S) &= \frac{V_{out}}{V_{in}} \qquad (5)\\ &= -\frac{1 - \frac{1}{SC(r_e1 + r_e2)}}{1 + \frac{1}{SC(r_e1 + r_e2)}}\\ &= -\frac{SC(r_e1 + r_e2) - 1}{SC(r_e1 + r_e2) + 1} \end{aligned}$$

where $j\omega = S$.

Equation (5) represents the characteristic of the phase shift circuit, indicating that the present phase shift circuit functions as a high-pass filter and a low-pass filter in combination by having a cut-off frequency $\omega_c$ which is $$\omega_c = \frac{1}{C(r_e1 + r_e2)} \qquad (6)$$

Accordingly, the phase difference between input and output signals becomes $-90°$ at the angular frequency $\omega_c$. As is clear from equation (6), the angular frequency $\omega_c$ at which the amount of phase shift is $-90°$ can be changed by changing the emitter resistance $(r_e1 + r_e2)$. The emitter resistance is related to the emitter current by the following equation:

$$r_e1 + r_e2 = \frac{kT}{qI_0} \qquad (7)$$

where k is the Boltzmann constant, T is an absolute temperature at the junction of transistor and q is the charge of an electron.

By combining equation (6) and equation (7), there results $$\omega_c = \frac{qI_0}{ckT} \qquad (8)$$

Therefore, in this phase shift circuit, the frequency at which the predetermined phase shift amount of $-90°$ is obtained can be changed by changing the current value $I_0$ of the variable current source 150.

For example, when considering the case wherein the center frequency which is normally $f_0$ as obtained from the characteristic curve (A) in FIG. 5 is varied by reason of production errors or temperature variations to $f_0'$ as obtained from the characteristic curve (B) in FIG. 5, the amount of phase shift changes from $-90°$ to $-80°$. In this instance, terminals 26 and 27 of the phase detector 15 are supplied with the non-phase shift signal and a $-80°$ phase shifted signal, respectively, and an output voltage developing at the terminal 24 becomes negative. This negative output voltage decreases the current value of the variable current source 150 and the emitter resistance $(r_e1+r_e2)$ is decreased pursuant to equation (7). As a result, the center frequency of the phase shift circuit is indicated by equation (6) is decreased from $f_0'$ and the phase shift circuit wins stability when the center frequency coincides with $f_0$. In the case wherein the center frequency is varied in the reverse direction, it can be corrected in a similar manner. Thus, the amount of phase shift can be so controlled as to be fixed to the predetermined value.

Since the current value of the variable current source 150 is determined by the output voltage of the phase detector 15, the phase shift circuit can be controlled so as to always take the phase shift amount of $-90°$. In the foregoing description, the amount of phase shift $\theta$ by the phase shift circuit is predetermined to be $-90°$ but obviously, it may be fixed to a desired value by adding the voltage at the terminal 24 with a corresponding DC voltage to change the current value $I_0$ of the current source 150 correspondingly.

Figure 2:
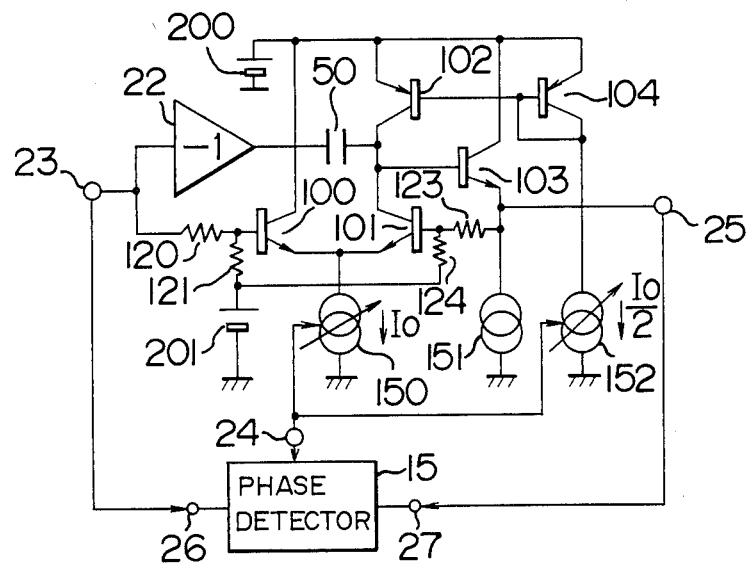
FIG. 2 is a circuit diagram of another embodiment of the invention.

FIG. 2 illustrates another embodiment of the variable phase shift circuit. The base electrodes of transistors 100 and 101 constituting a differential amplifier pair are connected with attenuators constituted by registors 120, 121, 123 and 124. When the respective resistors 120, 121, 123 and 124 have resistnces $R_{120}$, $R_{121}$, $R_{123}$ and $R_{124}$ which are such that $R_{120}=R_{123}$ and $R_{121}=R_{124}$, a transfer function $H_2(S)$ can be expressed as $$H_2(S) = -\frac{S(r_e1 + r_e2)\left(\frac{R_{120} + R_{121}}{R_{121}}\right)C - 1}{S(r_e1 + r_e2)\left(\frac{R_{120} + R_{121}}{R_{121}}\right)C + 1}. \qquad (9)$$

From equation (9), $$\begin{aligned} \omega_c &= \frac{1}{\left(\frac{R_{120} + R_{121}}{R_{121}}\right)C(r_e1 + r_e2)} \qquad (10)\\ &= \left(\frac{R_{121}}{R_{120} + R_{121}}\right) \cdot \frac{1}{C(r_e1 + r_e2)} \end{aligned}$$

can be obtained. Equation (10) indicates that the capacitor 50 in the circuit of FIG. 2 must have a capacitance which is $$\frac{R_{121}}{R_{120} + R_{121}}$$

times the capacitance of the capacitor 50 in the circuit of FIG. 1 in order that $\omega_c$ obtained with the FIG. 2 circuit coincides with that obtained with the FIG. 1 circuit. This means that the circuit of this embodiment is satisfied with a smaller capacitance of the capacitor 50 and suitable for realization with an integrated circuit.

Figure 3:
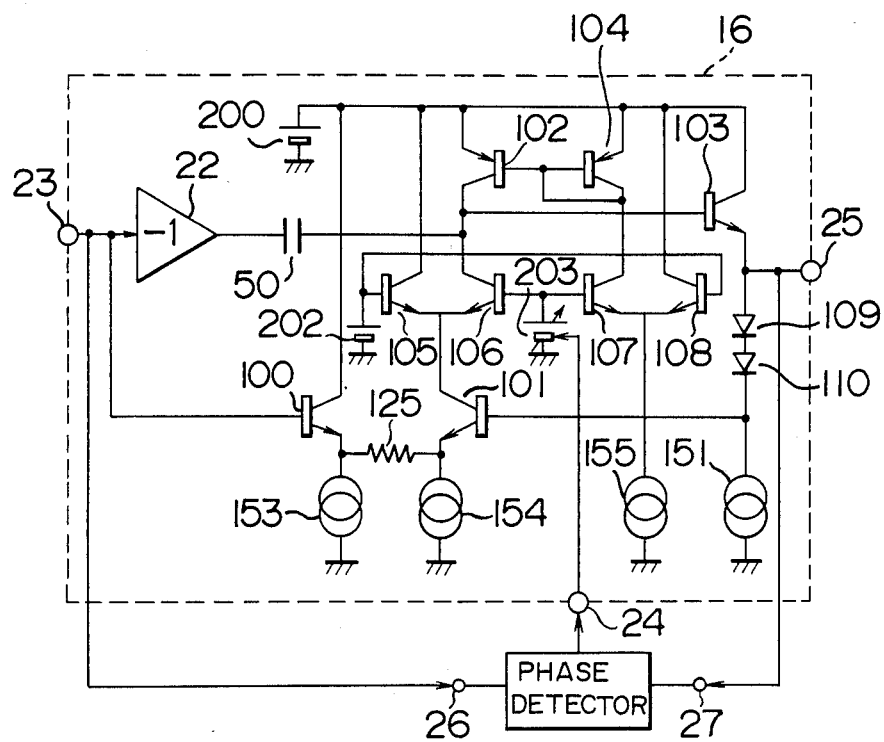
FIG. 3 is a circuit diagram of still another embodiment of the invention.

FIG. 3 illustrates a further embodiment of the variable phase shift circuit. Connected between the emitter electrodes of transistors 100 and 101 constituting a differential amplifier pair is a resistor 125. The collector electrode of the transistor 101 is connected with a second differential amplifier pair comprised of transistors 105 and 106, and a current source 155 is connected with a third differential amplifier pair comprised of transistors 107 and 108. The base electrodes of the transistors 105 and 108 are connected to a constant voltage source 202 and the base electrodes of the transistors 106 and 107 are connected to a variable voltage source 203 which is controlled by voltage supplied externally. The collector electrode of each of the transistors 107 and 106 is connected with a current mirror circuit comprised of transistors 104 and 102. Given $$\frac{I_{106}}{I_{105} + I_{106}} = \frac{1}{K},$$

a transfer function $H_3(S)$ of the present circuit is expressed as $$H_3(S) = -\frac{SK R_{125} C - 1}{SK R_{125} C + 1} \quad (11)$$

where $I_{105}$ and $I_{106}$ are emitter currents of the transistors 105 and 106, and $R_{125}$ is a resistance of the resistor 125.

From equation (11), there results $$\omega_c = \frac{1}{K CR_{125}} \quad (12)$$
$$= \frac{1}{K} \cdot \frac{1}{CR_{125}}.$$

The value of K in equation (12) and consequently $\omega_c$ can be changed when the voltage value of the variable voltage source 203 is changed by the externally supplied voltage to change currents flowing through the second and third differential amplifier pairs. Equation (12) indicates that the frequency of the phase shift circuit can be decreased by the order of 1/K and the capacitance of capacitor 50 in the FIG. 3 circuit can be reduced by the order of 1/K for the center frequency $f_0$. Accordingly, the area to be occupied by the capacitor can be decreased and the FIG. 3 phase shift circuit is particularly suitable for realization with an integrated circuit.

It should therefore be understood that the phase shift circuit of this invention can be used at a desired frequency with the phase shift amount fixed to a desirably predetermined value, without being affected by production errors and temperature variations.

FIG. 4 is a block diagram illustrating a color signal processing circuit of color television receiver set to which the phase shift circuit of the invention is applied. Referring to FIG. 4, the processing circuit comprises a video signal input terminal 1, a band-pass filter 2 for extracting the color signal component from the video signal, an ACC (automatic color control) circuit 3 for maintaining the burst signal at a constant level, and a burst gate circuit 4 for separating the carrier chrominance signal and the burst signal. The carrier chrominance signal separated fromtthe burst signal at the burst gate circuit is amplified at a second band-pass amplifier 5 and then demodulated at a chrominance signal demodulator circuit 6 to provide color-difference signals B-Y, G-Y and R-Y at output terminals 7, 8 and 9, respectively. The burst signal separated from the carrier chrominance signal is applied to a color killer circuit 10 and an APC (automatic.phase control) detection circuit 11 of a color synchronizing circuit 21. A phase shift circuit 14a in the color synchronizing circuit 21 comprises a phase detector 15 and a variable phase shifter 16 and produces an output signal b which 90° phase leads with respect to an input signal a from a crystal oscillator 17. The signals a and b are processed by an adder 18 and a subtractor 19 to produce signals c and d which in turn are added together at a variable adder circuit 20 responsive to the output signal of the APC detection circuit 11. The variable adder circuit 20 provides a signal e which has a maximum of ±45° phase shift with respect to the signal a. The signal e is fed back to the crystal oscillator 17 so that the phase of the oscillation signal a, applied to a TINT (tint) circuit 13, can be changed within a range of ±45°. The phase shift circuit 14a and components associated therewith constitute a VCO (voltage controlled oscillator) 12. Since the phase shift circuit 14a in accordance with teachings of the present invention operates with the amount of phase shift fixed to a predetermined value, the range of change of phase shift for the oscillation signal a never shifts.

In this manner, accurate phase controlling can be achieved in the color synchronizing circuit incorporating the phase shift circuit of the present invention.

We claim:
1. A phase shift circuit comprising:
a variable phase shifter having a first terminal supplied with an input signal, a second terminal for delivering an output signal resulting from phase shifting the input signal supplied to said first terminal and a third terminal supplied with a control signal for controlling the amount of phase shift between the input and output signals;
said variable phase shifter further comprising; differential amplifier means having an input terminal connected to said first terminal, an inverting input terminal, an output terminal connected to said second terminal, and a gain control terminal; a capacitor having one side connected to the output terminal of said differential amplifier means; phase inverting means connected between said first terminal and the other side of said capacitor; connection means for DC coupling sard output terminal and inverting input terminal of said differential amplifier means; and variable current source means for supplying a current based on the voltage supplied to said third terminal, said current being supplied to said gain control terminal of said differential amplifier means; and
a phase detector supplied with said input and output signals of said variable phase shifter for generating a voltage complying with a phase difference between said input and output signals and supplying to said third terminal the voltage complying with the phase difference as said control signal to thereby suppress variation in the phase shift amount.
2. A phase shift circuit comprising:
a first terminal supplied with an input signal;

a second terminal for delivering an output signal resulting from phase shifting the input signal supplied to said first terminal;

a third terminal supplied with a control signal for controlling the amount of phase shift between the input and output signals;

differential amplifier means comprised of first and second transistors each having base, collector and emitter electrodes, the base electrode of said first transistor being connected to said first terminal, the base electrode of said second transistor being connected to said second terminal, the emitter electrodes of said first and second transistors being connected in common;

a voltage source for feeding voltage to the collector electrodes of said first and second transistors;

a capacitor having one side connected to the collector electrode of said second transistor;

phase inverting means connected between said first terminal and the other side of said capacitor;

connection means for DC coupling the collector and base electrodes of said second transistor;

a variable current source means for supplying a current based on a voltage value supplied to the third terminal, said variable current source means being connected to the emitter electrodes of said first and second transistors; and a phase detector having a first input terminal connected to said first terminal, a second input terminal connected to said second terminal and a voltage output terminal connected to said third terminal and generating, as said control signal at said voltage output terminal, a voltage complying with a phase difference between signals supplied to said first and second input terminals.

3. A phase shift circuit according to claim 2 further comprising attenuator means connected to the base electrode of each of said first and second transistors.

4. A phase shift circuit comprising:

a first terminal supplied with an input signal;

a second terminal for delivering an output signal resulting from phase shifting the input signal supplied to said first terminal;

a third terminal supplied with a control signal for controlling the amount of phase shift between the input and output signals;

first differential amplifier means comprised of first and second transistors each having base, emitter and collector electrodes, the base electrode of said first transistor being connected to said first terminal, the base electrode of said second transistor being connected to said second terminal, the emitter electrodes of said first and second transistors being connected in common;

second differential amplifier means comprised of third and fourth transistors each having base, emitter and collector electrodes, the emitter electrodes of said third and fourth transistors being connected in common to the collector electrode of said second transistor;

voltage source means for feeding power supply voltage to the collector electrodes of said first, third and fourth transistors and constant voltage to the base electrode of said third transistor;

a capacitor having one side connected to the collector electrode of said fourth transistor;

phase inverting means connected between said first terminal and the other side of said capacitor;

connection means for DC coupling the collector electrode of said fourth transistor and the base electrode of said second transistor;

a variable voltage source means for generating a voltag based on a voltage value supplied to said third terminal, said variable voltage source means being connected to the base electrode of said fourth transistor; and a phase detector having a first input terminal connected to said first terminal, a second input terminal connected to said second terminal and a voltage output terminal connected to said third terminal and generating, as said control signal at said voltage output terminal, a voltage complying with a phase difference between signals supplied to said first and second input terminals.

* * * * *